(12) United States Patent
Meehan et al.

(10) Patent No.: US 6,411,426 B1
(45) Date of Patent: Jun. 25, 2002

(54) APPARATUS, SYSTEM, AND METHOD FOR ACTIVE COMPENSATION OF ABERRATIONS IN AN OPTICAL SYSTEM

(75) Inventors: Michael F. Meehan, Southbury; David G. Taub, Stamford; Jorge S. Ivaldi, Trumbull, all of CT (US)

(73) Assignee: ASML, US, Inc., Wilton, CT (US)

( * ) Notice: Subject to any disclaimer, the term of this patent is extended or adjusted under 35 U.S.C. 154(b) by 29 days.

(21) Appl. No.: 09/702,854

(22) Filed: Nov. 1, 2000

Related U.S. Application Data
(60) Provisional application No. 60/199,400, filed on Apr. 25, 2000.

(51) Int. Cl.[7] ............................ G02B 26/00; H01S 3/08; H01L 41/06
(52) U.S. Cl. .................. 359/291; 359/224; 359/198; 359/199; 359/876; 372/107; 310/26; 310/328
(58) Field of Search ................. 359/290, 291, 359/221, 224, 202, 198, 199, 876, 883; 372/107; 310/26, 328

(56) References Cited

U.S. PATENT DOCUMENTS

| | | | | |
|---|---|---|---|---|
| 4,203,654 A | * | 5/1980 | Ellis ............................ | 359/224 |
| 4,660,941 A | * | 4/1987 | Hattori et al. ................ | 359/224 |
| 4,705,365 A | * | 11/1987 | Wakita et al. ............... | 359/224 |
| 4,708,420 A | * | 11/1987 | Liddiard ...................... | 359/199 |
| 4,917,484 A | * | 4/1990 | Heinz .......................... | 359/224 |
| 5,172,261 A | * | 12/1992 | Kato et al. ................... | 359/224 |
| 5,828,690 A | * | 10/1998 | Unternahrer et al. ....... | 372/107 |
| 6,188,502 B1 | * | 2/2001 | Aoki ........................... | 359/198 |

* cited by examiner

Primary Examiner—Loha Ben
(74) Attorney, Agent, or Firm—Sterne, Kessler, Goldstein & Fox PLLC (57) ABSTRACT

Active compensation of aberrations in an optical system involves attaching first and second force bars to a mirror. The first force bar is bifurcated to form an opening near its longitudinal midpoint. This opening defines first and second opposed surfaces. A second force bar is substantially perpendicular to the first force bar and extends through the opening of the first force bar so that a medial portion of the second force bar is disposed in the opening of the first force bar. The second force bar is connected to the first surface by at least one actuator. Longitudinal movement of the actuator causes a displacement of the mirror. A support structure is used to support the weight of the force bars and actuator. The force bars are connected to the support structure by a plurality of flexures. A control module receives information from a sensing module and controls the actuator. Other embodiments use more than two force bars and are capable of more fully compensating for any aberrations in the optical system.

10 Claims, 7 Drawing Sheets

APPARATUS, SYSTEM, AND METHOD FOR ACTIVE COMPENSATION OF ABERRATIONS IN AN OPTICAL SYSTEM

CROSS REFERENCE TO RELATED APPLICATIONS

This application is related to and claims priority to U.S. Provisional Application Ser. No. 60/199,400, filed Apr. 25, 2000, titled "Apparatus, System and Method for Active Compensation of Astigmatism in a Catadioptric Optical System," which is herein incorporated by reference in its entirety.

BACKGROUND OF THE INVENTION

1. Field of the Invention

This invention relates generally to an optical system. More particularly, it relates to an optical reduction system used in semiconductor manufacturing.

2. Related Art

Semiconductors are typically manufactured using various photolithographic techniques, which are implemented using complex optical systems. For example, one complex optical system used in the manufacturing of semiconductors is a catadioptric optical reduction system. While these complex optical systems perform adequately for their intended purpose, controlling aberrations in these optical systems is becoming increasingly important as semiconductor manufacturers strive to make semiconductor components smaller. Aberrations limit the minimum size of component features that may be reproduced on a semiconductor chip.

Imaging in complex optical systems can be controlled using multiple lenses and one or more mirrors. To reproduce small component features on a semiconductor using such systems, a passive device can be used to apply a force to a mirror of the optical system and thereby compensate for some of the aberrations in the optical system. For example, a passive device attached to a mirror can be used to compensate for at least some of the astigmatism in an optical system with relative success. Known passive devices have limitations, however, and they do not provide an element of control needed to compensate for changes in astigmatism and other aberrations that result from environmental factors, such as changes in temperature.

What is needed are new means for controlling aberrations in complex optical systems that permit such systems to be used for reproducing very small component features on a semiconductor.

SUMMARY OF THE INVENTION

The present invention provides an apparatus, system, and method for active compensation of aberrations in an optical system. In a preferred embodiment, first and second force bars are attached to a mirror. The first force bar is bifurcated to form an opening near its longitudinal midpoint. This opening defines first and second opposed surfaces. The second force bar is substantially perpendicular to the first force bar and extends through the opening of the first force bar so that a medial portion of the second force bar is disposed in the opening of the first force bar. The second force bar is connected to the first surface by at least one actuator. Longitudinal movement of the actuator applies a force to the mirror causing a displacement or a change in the shape of the mirror. A support structure is used to support the weight of the force bars and actuators. The force bars are connected to the support structure by a plurality of flexures.

In a preferred embodiment of the invention, the force bars are leaf springs and the actuators are pneumatic bellows. A sensing module for measuring a parameter used to control aberrations in the optical system provides information to a control module. The control module receives information from the sensing module and controls an air supply module to operate the pneumatic bellows.

BRIEF DESCRIPTION OF THE FIGURES

The accompanying drawings, which are incorporated herein and form part of the specification, illustrate the present invention and, together with the description, further serve to explain the principles of the invention and to enable a person skilled in the relevant art to make and use the invention.

The present invention is described with reference to the accompanying drawings. In the drawings, like reference numbers indicate identical or functionally similar elements. Additionally, the leftmost digit of a reference number identifies the drawing in which the reference number first appears.

DETAILED DESCRIPTION OF THE PREFERRED EMBODIMENTS

Overview of the Invention and Terminology

The present invention provides an apparatus, system, and method for active compensation of aberrations in an optical system. For example, the present invention can be used to actively compensate for astigmatism and other aberrations in an optical reduction system used in semiconductor manufacturing. The invention uses force bars and actuators to bend a mirror's reflective surface and thereby selectively alter incident electromagnetic wavefronts relative to the reflective action of the unbent mirror. In an embodiment, the force bars are attached to a peripheral portion of the mirror by flexures.

To better describe the present invention, the folowing terms are defined:

The term "aberration" means an optical system defect that causes an image to deviate from the rules of paraxial imagery. Aberrations can be described, for example, by Zernike circle polynomials. Zernike circle polynomials, however, are not the only means for describing aberrations as would be known to a person skilled in the relevant art.

The term "active compensation" means deforming or bending optical elements, such as the reflective surface of a mirror, by various means for the purpose of correcting or controlling the performance of an optical system and its associated imaging. Active compensation can be used to compensate, for example, for astigmatism due to changing environmental conditions such as temperature. Active compensation systems can involve open-loop or closed-loop control elements to control the deforming or bending of an optical element without requiring manual intervention, as would be known to a person skilled in the relevant art given the description herein.

The term "actuator" means any apparatus that can be used to apply force or displacement to a mechanical device. An actuator may be operated, for example, electromechanically or pneumatically.

The term "aspheric mirror" means a mirror that has a nonspherical surface. The aspheric surface of a mirror can be used, for example, in a catadioptric optical system, to alter an incident electromagnetic wavefront relative to the reflective action of a spherical surface.

The term "astigmatism" means an aberration that results in the tangential and radial image planes of an optical system being separated axially.

The term "catadioptric optical system" means an optical system whose focal power is achieved using both reflection and refraction. While the relative powers of the lenses and mirrors in a catadioptric optical system vary from system to system, such systems are typically characterized by the use of reflective surfaces to achieve a significant portion of the systems focal power, in combination with refractive surfaces of little or zero focal power. These systems produce an image that has improved aberrational characteristics.

The term "flexure" means a device, which is stiff in substantially only one dimension. Two ball joints connected by a rod is an example of a flexure. The flexures used in a preferred embodiment of the present invention comprise metal rods that have eight notches cut out of them arranged as four opposed pairs. The opposed pairs of notches are cut out of one end of the metal rod so that the bottoms of the notches point to one another and are almost touching. Two additional notches are cut out of the rod, just below the first opposed pair of notches, oriented at a 90-degree angle (perpendicular) to the first opposed pair of notches. The opposite end of the metal rod has two pairs of notches cut in a similar manner.

The term "force bar" means a longitudinal device capable of receiving a force near its midpoint and transferring that force to its ends. A leaf spring and a metal rod are examples of a force bar.

The term "parameter related to an aberration" means any parameter that can be monitored and that is useful for predicting the presence of an aberration in an optical system and/or for controlling an optical element to compensate for an aberration. Examples include temperature, pressure, and electromagnetic energy.

The term "corrective signal" means any signal or value used in determining a force or displacement to be applied to an optical element of an optical system in order to actively correct or compensate for an aberration in the optical system.

Figure 1:
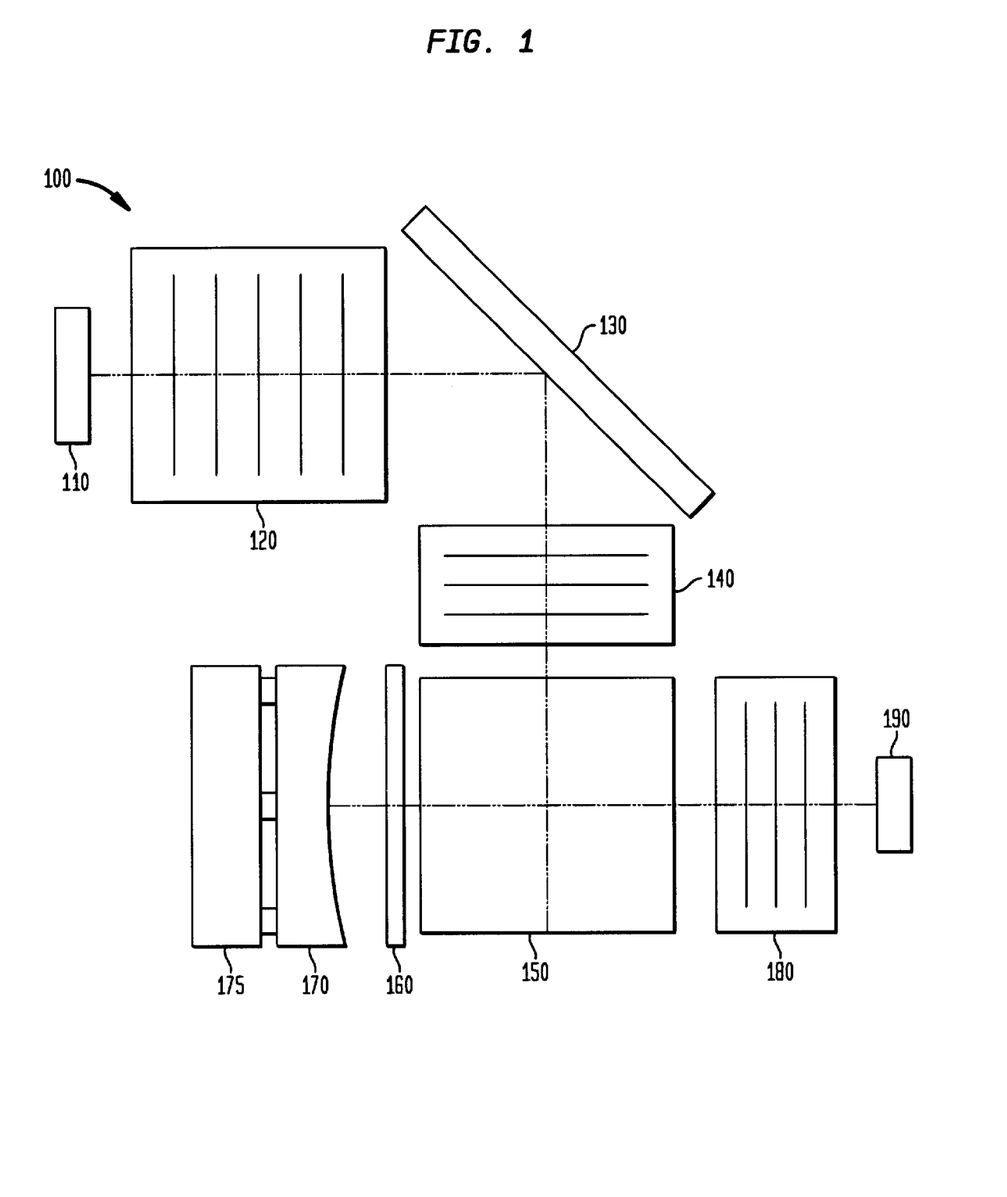
FIG. 1 is a diagram of an example optical system in which the present invention may be used.

FIG. 1 shows an example optical system 100 in which the present invention can be used. Example optical system 100 is presented by way of example only, and it is not intended to limit the scope of the present invention. As will be apparent to a person skilled in the relevant art given the description herein, the present invention can be used to compensate for aberrations in many different optical systems.

Example optical system 100 is a catadioptric optical reduction system. Example optical system 100 is used in the manufacturing of semiconductors. As can be seen in FIG. 1, example optical system 100 contains a reticle 110, a first lens group 120, a folding mirror 130, a second lens group 140, a beamsplitter block 150, a quarter-waveplate 160, a concave mirror 170, an aberration compensation module 175, and a third lens group 180. A semiconductor or wafer is placed at an image plane 190.

An incident electromagnetic wavefront entering optical system 100 at reticle 110 converges to a focal point at image plane 190. Optical system 100 can be used to reproduce the features of a semiconductor mask located at reticle 110 on a wafer located at image plane 190. An incident electromagnetic wavefront enters optical system 100 at reticle 110 and passes through lens group 120. Folding mirror 130 is used to direct an incident electromagnetic wavefront exiting lens group 120 into lens group 140 and beamsplitter block 150. Beamsplitter block 150 directs a portion of the incoming electromagnetic wavefront through quarter-waveplate 160 to mirror 170. Mirror 170 reflects an incoming electromagnetic wavefront back through quarter-waveplate 160 and beamsplitter block 150 into lens group 180. When the electromagnetic wavefront exits lens group 180, it converges to a focal point at image plane 190.

As can be seen in FIG. 1, aberration compensation module 175 is attached to mirror 170. Aberration compensation module 175 is used, for example, to compensate for astigmatism in both mirror 170 and optical system 100. Aberration compensation module 175 compensates for astigmatism, for example, by applying a force to the periphery of mirror 170 and thereby bending and deforming the reflective surface of mirror 170. In optical system 100, mirror 170 is preferably a concave, aspheric mirror that can be used to alter incident electromagnetic wavefronts. The amount that an incident electromagnetic wavefront is altered, relative to the normal reflective action of mirror 170, is controlled by the bending or displacing force applied by aberration compensation module 175 to mirror 170.

Aberrations in an Optical System

Every optical system has aberrations. Aberrations are caused by the inherent shortcomings of the lenses and mirrors used in an optical system. For example, astigmatism is an example of a monochromatic aberration, which causes image blurring. As described below, the present invention can be used to correct or compensate for astigmatism in optical 100. The invention is not limited to correcting only astigmatism in optical system 100, however, as will be apparent to a person skilled in the relevant art given the description of the present invention herein.

Figure 2A:
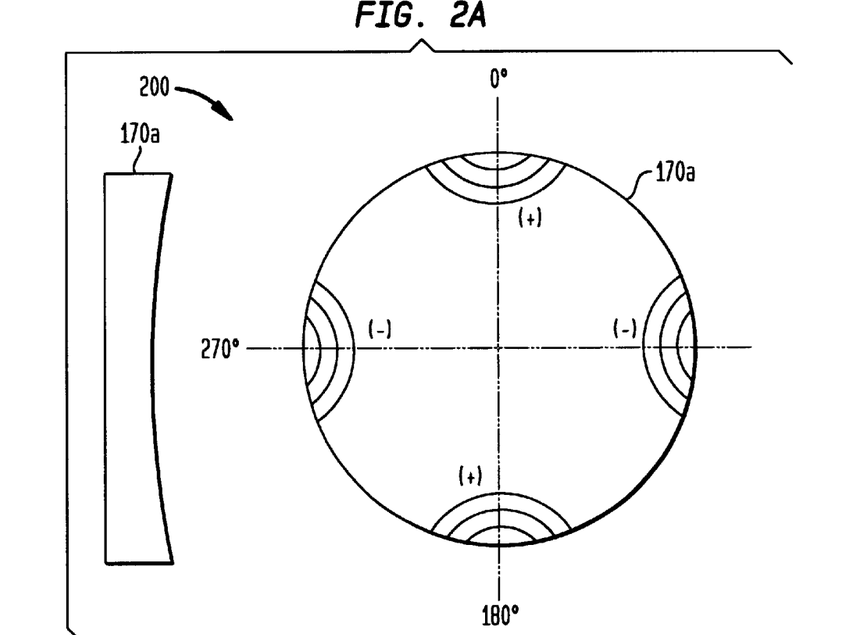
FIG. 2A is a diagram of a mirror having a Z5 Zernike circle aberration.
Figure 2B:
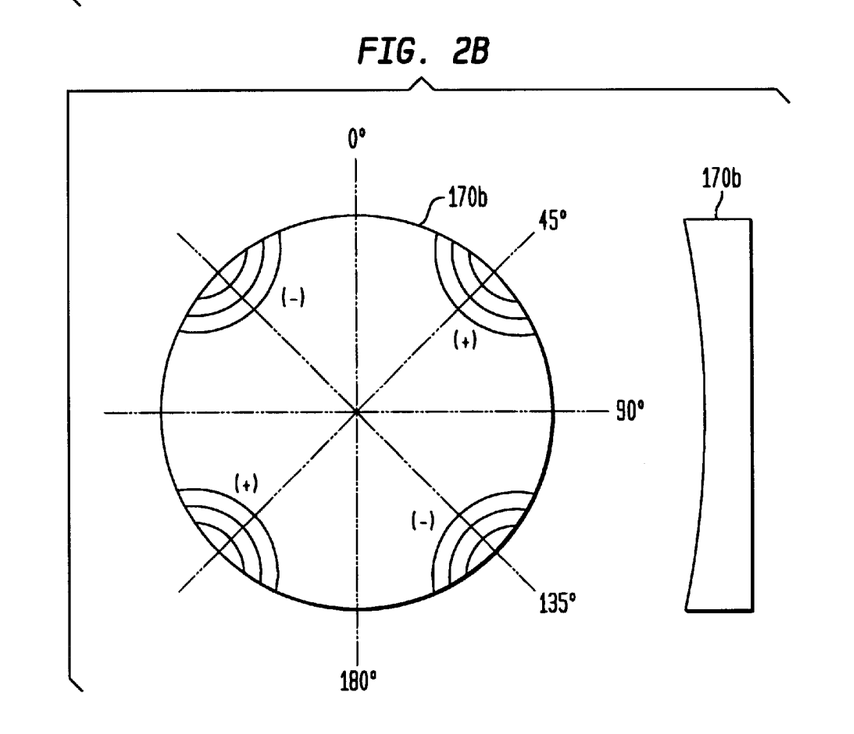
FIG. 2B is a diagram of a mirror having a Z6 Zernike circle aberration.

FIGS. 2A and 2B are example diagrams of mirrors with astigmatism. As would be known to a person skilled in the relevant art, aberrations in an optical system can be described by Zernike circle polynomials. FIG. 2A shows a mirror 170a having a Z5 Zernike circle polynomial astigmatism. FIG. 2B shows a mirror 170b having a Z6 Zernike circle polynomial astigmatism. As can be seen in FIGS. 2A and 2B, Z5 and Z6 astigmatism are offset from one another by forty-five degrees.

As depicted in FIG. 2A, mirror 170a has a concave, nonspherical reflective surface. The reflective surface of mirror 170a is deformed in a way that electromagnetic wavefronts incident upon the peripheral surface of mirror 170a at 0° and 180° will converge sooner than will electromagnetic wavefronts incident upon the peripheral surface of mirror 170a at 90° and 270°. The Z5 astigmatism of mirror 170a can be induced by attaching an aberration compensation module 175 to the non-reflecting surface of mirror 170a, as shown in FIG. 1. To correct or compensate for Z5 astigmatism in mirror 170a and/or in optical system 100, aberration compensation module 175 must apply a pushing or pulling force on the periphery of the non-reflective surface of the mirror 170a at 0° and 180° and an opposite pushing or pulling force on the periphery of the non-reflective surface of the mirror 170a at 90° and 270°. It will be understood by a person skilled in the relevant art why applying forces in this manner corrects or compensates for astigmatism.

As depicted in FIG. 2B, mirror 170b also has a concave, nonspherical reflective surface. The reflective surface of mirror 170b is deformed in a way that electromagnetic wavefronts incident upon the peripheral surface of mirror 170b at 45° and 225° will converge sooner than will electromagnetic energy wavefronts incident upon the peripheral surface of mirror 170b at 135° and 315°. The Z6 astigmatism of mirror 170b can be induced by attaching an aberration compensation module to the non-reflecting surface of mirror 170b and applying a pushing or pulling force on the periphery of the non-reflective surface of the mirror 170b at 45° and 225° and an opposite pushing or pulling force on the periphery of the non-reflective surface of the mirror 170b at 135° and 315°. As above, it will be understood by a person skilled in the relevant art why applying forces in this manner correct or compensate for Z6 astigmatism in mirror 170b and/or optical system 100.

As would be known to a person skilled in the relevant art, lenses and mirrors can have both Z5 and Z6 astigmatism. The significance of classifying astigmatism as either Z5 or Z6 astigmatism is that the principle of superposition applies to astigmatism in an optical system. As would be apparent to a person skilled in the relevant art given the discussion herein, any astigmatism in an optical system can be expressed as a combination of Z5 and Z6 astigmatism. This is important because aberration compensation module 175 can be designed to apply forces to the periphery of mirror 170 that will compensate for any combination of Z5 and Z6 astigmatism in optical system 100, as described below.

Astigmatism in optical system 100, or any portion thereof, is corrected or compensated for in a manner similar to that described above. Astigmatism in the lenses of lens group 120 and lens group 140 of optical system 100 will cause electromagnetic wavefronts to arrive at certain locations on the reflective surface of mirror 170 earlier than at other locations. To compensate for the difference in arrival times of the wavefronts, aberration compensation module 175 can be used to bend the reflective surface of mirror 170 in a manner that will advance or retard wavefronts arriving at a specific location on the reflective surface of mirror 170. Aberration compensation module 175 can also be used to compensate for astigmatism in lens group 180, as would be apparent to a person skilled in the relevant art given the discussion herein.

How well astigmatism can be corrected or compensated for in optical system 100 is dependent on the type of apparatus used to bend mirror 170, as further described below.

Apparatus for Passive Compensation of Astigmatism

Figure 3A:
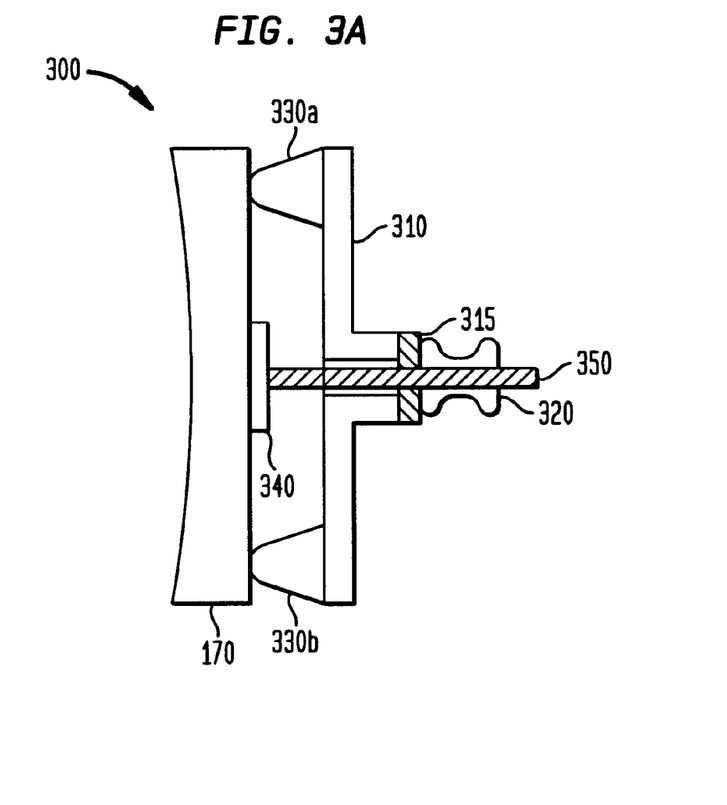
FIG. 3A is a side view of an example passive device for compensation of astigmatism in an optical system.

One means of compensating for astigmatism in optical system 100 is to attach a passive compensation device 300 to the non-reflective surface of mirror 170, as shown in FIG. 3A. While passive compensation devices, such as compensation device 300, work well for their intended purposes, they have limitations in their ability to compensate for astigmatism. For example, passive compensation devises do not provide the element of control needed to compensate for changes in astigmatism that result from environmental factors like temperature. In order to more clearly point out the features of the present invention, passive compensation device 300, and its limitations, are described below.

Figure 3B:
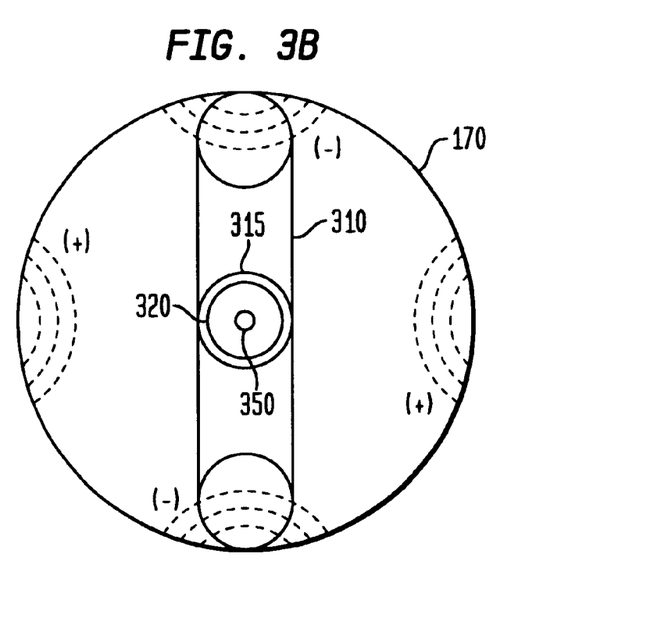
FIG. 3B is a top view of the example passive device for compensation of astigmatism in an optical system.

FIG. 3A (side view) and FIG. 3B (top view) illustrate passive compensation device 300. Passive compensation device 300 comprises a metal bar 310 and two feet 330a and 330b attached to the ends of metal bar 310. Passive compensation device 300 is attached to mirror 170 using a washer 315, a thumb nut 320, and a screw 350. Screw 350 is attached to the non-reflecting surface of mirror 170 using a countersunk washer 340.

Passive compensation device 300 can be used to compensate for astigmatism by aligning feet 330a and 330b with that portion of mirror 170 where a pushing force is required. For example, if passive compensation device 300 were attached to mirror 170a in FIG. 2A, feet 330a and 330b would be located at 90° and 270°, respectively. If passive compensation device 300 were attached to mirror 170b in FIG. 2B, feet 330a and 330b would be located at 135° and 315°, respectively. The amount of compensating force applied to mirror 170 is controlled by thumb nut 320.

As can be seen in FIGS. 3A and 3B, passive compensation devise 300 has significant limitations. These limitations prevent passive compensation device 300, and any similar passive compensation devices, from being used in an optical system that is required to reproduce very sharp images of fine features, such as micron-sized component features in a semiconductor.

For example, passive compensation device 300 does not have a control element for automatically adjusting the force applied to mirror 170 based on changing environmental conditions. As would be known to a person skilled in the relevant art, astigmatism in an optical system is effected by changes in environmental conditions such as temperature. Changes in temperature cause thermal stresses that tend to expand or contract different components of an optical system at different rates. Changes in temperature also cause changes in the refractive index of optical materials. As the index of refraction of optical materials change in a uniform temperature environment, aberrations including astigmatism develop. As these components' optical properties change with temperature, aberrations such as astigmatism in an optical system change. Because there is no means for actively varying the compensating force applied to mirror 170 when using passive compensation device 300, some amount of blurring will always occur at image plane 190 due to aberrations, for example astigmatism.

Passive compensation device 300 is also limited in its ability to compensate for astigmatism because it can only apply a pushing force to the periphery of mirror 170. As described above in reference to FIGS. 2A and 2B, both a pulling force and a pushing force must be applied to mirror 170 in order to accurately correct or compensate for aberrations such as astigmatism in an optical system.

As shown in FIG. 3A, passive device 300 applies a pulling force to the central axis of mirror 170. This is due to the means used to attach passive device 300 to mirror 170. This creates a pulling force on the axis of mirror 170 that tends to distort the reflecting surface of mirror 170 without compensating for astigmatism. As would be apparent to a person skilled in the relevant art, given the discussion herein, a pulling force applied to the central axis of mirror 170 will not correct or compensate for astigmatism because astigmatism is an off-axis aberration.

A further limitation of passive compensation device 300 is that its weight is supported by mirror 170. The weight of passive compensation device 300 thus tends to distort the reflective surface of mirror 170, and can prevent optical system 100 from reproducing very sharp images of fine features.

Additional limitations of passive compensation device 300, and similar devices, will be apparent to a person skilled in the relevant art given the discussion herein. These limitations are overcome by the present invention.

Apparatus for Active Compensation of Aberrations in an Optical System

The present invention provides an apparatus that can be used for active compensation of aberrations in an optical system. For example, the particular embodiments of the present invention described in detail below are capable of simultaneously compensating for both Z5 and Z6 astigmatism. As will be apparent to a person skilled in the relevant art given the description herein, embodiments of the present inventions are capable of compensation for any aberration in an optical system.

Figure 4A:
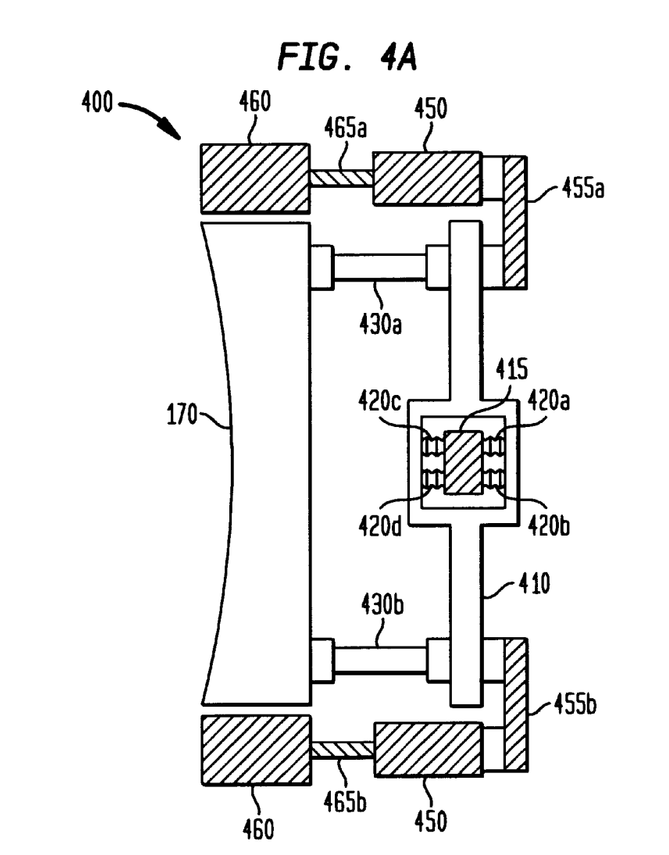
FIG. 4A is a side view of an example apparatus for active compensation of astigmatism in an optical system according to an embodiment of the present invention.
Figure 4B:
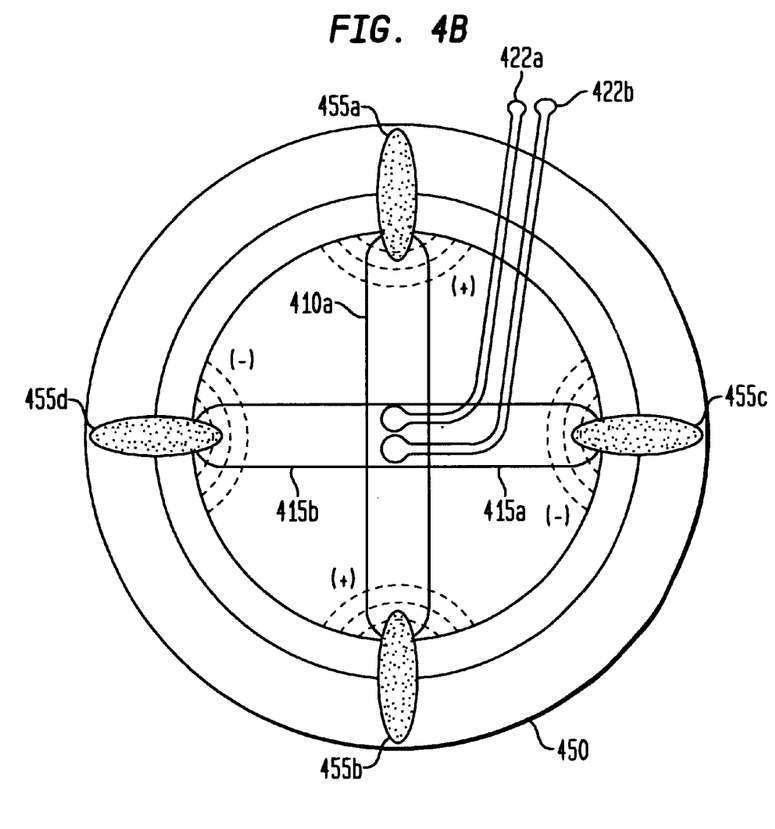
FIG. 4B is a top view of the example apparatus for active compensation of astigmatism in an optical system according to an embodiment of the present invention.

FIG. 4A (side view) and FIG. 4B (top view) depict a compensation module 400 for active compensation of astigmatism in optical system 100 according to one embodiment of the present invention. Compensation module 400, comprises a force bar 410 connected to a force bar 415 by actuators 420. Force bars 410 and 415 are attached to mirror 170 by a plurality of flexures 430. The weight of force bars 410 and 415, as well as the weight of the other components of compensation module 400, is supported by support structure 450 rather than by mirror 170.

As can be seen in FIGS. 4A and 4B, force bar 410 is substantially perpendicular to force bar 415. In an embodiment, force bar 410 has an opening near its longitudinal midpoint. This opening is formed in force bar 410 by bifurcating force bar 410 near its midpoint so that it has first and second opposed surfaces. Force bar 415 is passed through the opening in force bar 410 and partially resides in the opening. This arrangement permits actuators 420a and 420b to connect force bar 415 to the first opposed surface of force bar 410 and actuators 420c and 420d to connect force bar 415 to the second opposed surface of force bar 410. As would be apparent to a person skilled in the relevant art, only one actuator 420 is needed for the invention to function properly and other means for connecting force bars 410 and 415 using an actuator 420 are possible. For example, force bar 410 might not have an opening. In that case, force bar 415 can be connected to force bar 410 with only one actuator located at the crossing point of force bars 410 and 415.

In the example embodiment show in FIG. 4A and 4B, the ends of force bars 410 and 415 are attached to the periphery of mirror 170 by flexures 430. One end of force bar 410 is attached to mirror 170 by a flexure 430a. A second end of force bar 410 is attached to mirror 170 by a flexure 430b. In an embodiment of the present invention, force bars 410 and 415 are each made from metal. Force bars 410 and 415 can also be leaf springs.

In the example embodiment show in FIGS. 4A and 4B, actuators 420 are pneumatic bellows. Control air is supplied to pneumatic bellows 420 using air supply lines 422. As shown in FIGS. 4A and 4B, air supply line 422a supplies control air to pneumatic bellows 420a and air supply line 422b supplies control air to pneumatic bellows 420b. Additional air supply lines (not shown) supply control air to optional pneumatic bellows 420c and 420d if required. The ends of force bar 410 will apply a pulling force on the periphery of mirror 170 when pneumatic bellows 420a and 420b are pressurized to a pressure greater than that of pneumatic bellows 420c and 420d. Under these same conditions, the ends of force bar 415 will apply a pushing force on the periphery of mirror 170. Venting pneumatic bellows 420c and 420d to the environment and pressurizing pneumatic bellows 420a and 420b to a pressure greater than atmospheric pressure will cause the ends of force bar 410 to apply a pulling force to the periphery of mirror 170 and the ends force bar 415 to apply a pushing force to the periphery of mirror 170.

In another embodiment of the present invention, actuators 420 can be electromechanical devices, such as solenoids, rather than pneumatic devices. Using actuators other than pneumatic bellows are contemplated and can be advantageous in optical systems where a source of compressed air is not readily available. In other embodiments, actuators 420 can be hydraulic or piezoelectric devices. The number of actuators 420 can be varied.

As can be seen in FIGS. 4A and 4B, the weight of force bars 410 and 415, as well as the weight of the other components of compensation module 400, is supported by support structure 450. The ends of force bars 410 and 415 are connected to support structure 450 by flexures 455. In a preferred embodiment, support structure 450 is a ring. Support structure 450 is connected to a weight bearing portion 460 of optical system 100 by connecting devices 465. Support structure 450 can be connected to any weight bearing portion 460 of optical system 100 that can support the weight of compensation module 400 without affecting the performance of optical system 100. Support structure 450 can be connected to weight bearing portion 460 by any connecting devices 465 that will perform the function of connecting support structure 450 to weight bearing portion 460.

Figure 5A:
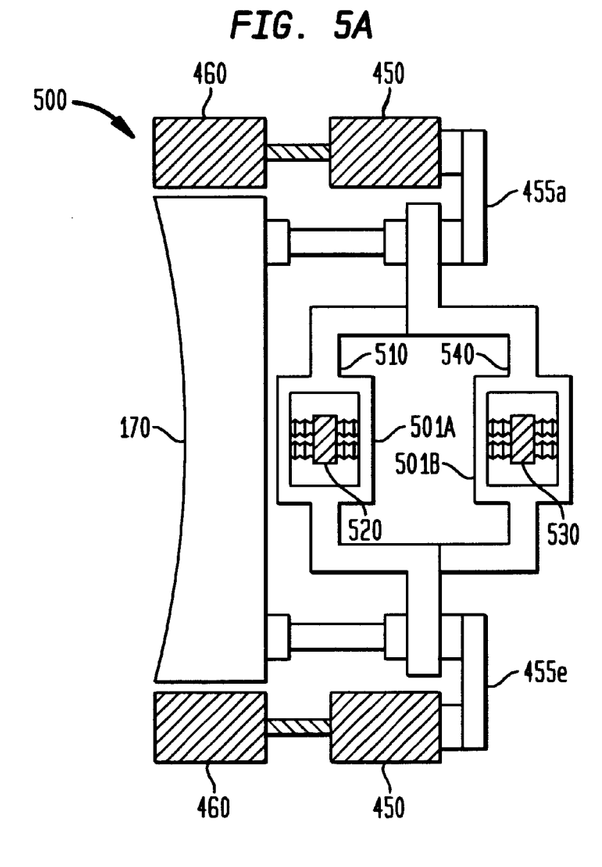
FIG. 5A is a side view of an example apparatus for active compensation of astigmatism in an optical system according to a second embodiment of the present invention.
Figure 5B:
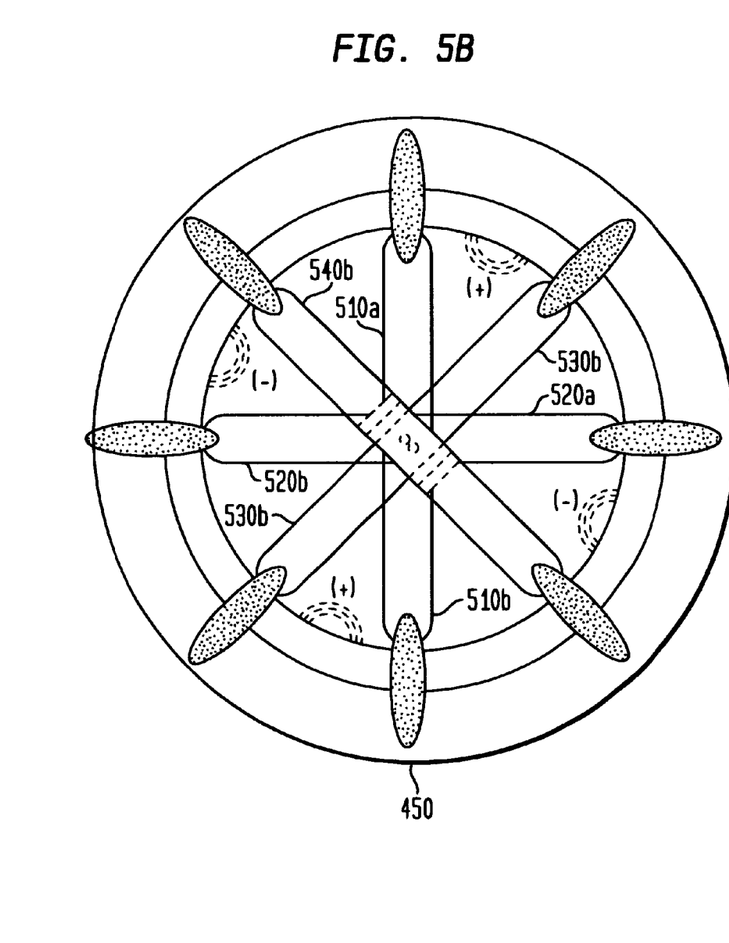
FIG. 5B is a top view of the example apparatus for active compensation of astigmatism in an optical system according to a second embodiment of the present invention.

FIG. 5A (side view) and FIG. 5B (top view) depict a compensation module 500 that is capable of simultaneously compensating for combinations of both Z5 and Z6 astigmatism in an optical system. As can be seen in FIGS. 5A and 5B, compensation module 500 comprises two adjustable force modules 501A and 501B, which operate in a manner similar to compensation module 400. Each adjustable force module 501 comprises two substantially perpendicular force bars connected by actuators. In FIG. 5A, adjustable force modules 501B is shown rotated 45 degrees from its actual position in order to more clearly show the openings in force bar 540. The actual orientation of force module 501B is that shown in FIG. 5B. The geometry of the attachment flexures 430 and force bar comprising force modules 501 are selected along with other hardware to allow independent operation without mechanical interference.

As shown in FIG. 5B, adjustable force module 501A is aligned to compensate for Z5 astigmatism and comprises force bars 510 and 520. Adjustable force module 501B is aligned to compensate for Z6 astigmatism and comprises force bars 530 and 540. As will be apparent to a person skilled in the relevant art(s), given the discussion herein, compensation module 500 can be adjusted to actively compensate for any astigmatism in optical system 100.

Although compensation module 500 is shown as comprising only two adjustable force modules, there are situations where more than two adjustable force modules may be used. For example, more than two adjustable force modules may be used in applications where warranted due to the size of mirror 170 and the maximum force that can be applied to mirror 170 by a single adjustable force module. Other applications where it may be desirable to use more than two adjustable force modules will be apparent to a person skilled in the relevant art given the discussion herein. For example, when forces are to be applied at different distances from the central axis.

Figure 6:
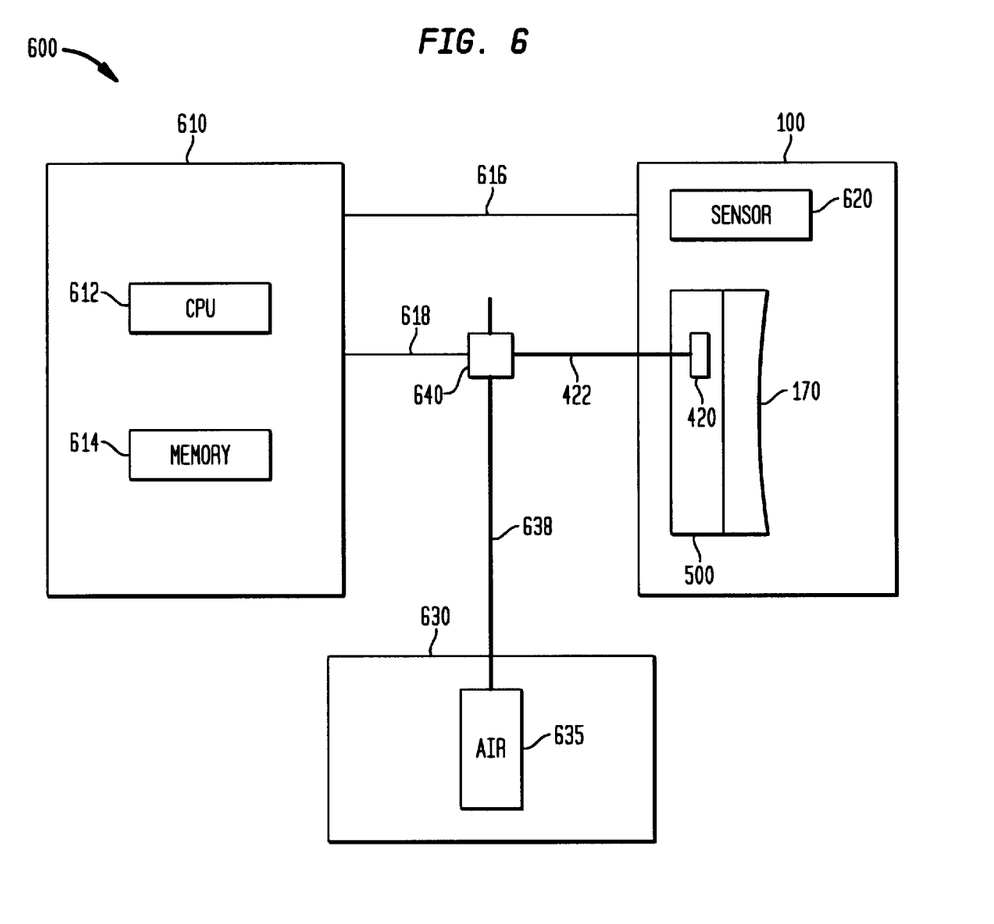
FIG. 6 is a diagram of an example system for active compensation of astigmatism in an optical system according to an embodiment of the present invention.

System and Method for Active Compensation of Aberrations in an Optical System FIG. 6 illustrates a preferred embodiment of a system 600 for actively controlling aberrations such as astigmatism in optical system 100 according to the present invention. System 600 comprises a compensation module 500 having a pneumatic actuator 420, a control module 610, a sensing module 620, an air supply module 630, and a three-way valve 640. Pneumatic compensation module 500 operates as described above. The operation of compensation module 500 is controlled by control module 610 using information received from sensing module 620. Compensation module 500 is connected to air supply module 630 using three-way valve 640 and air supply lines 422 and 638. Control module 610 controls three-way valve 640 to control the pressure in pneumatic actuator 420.

Figure 7:
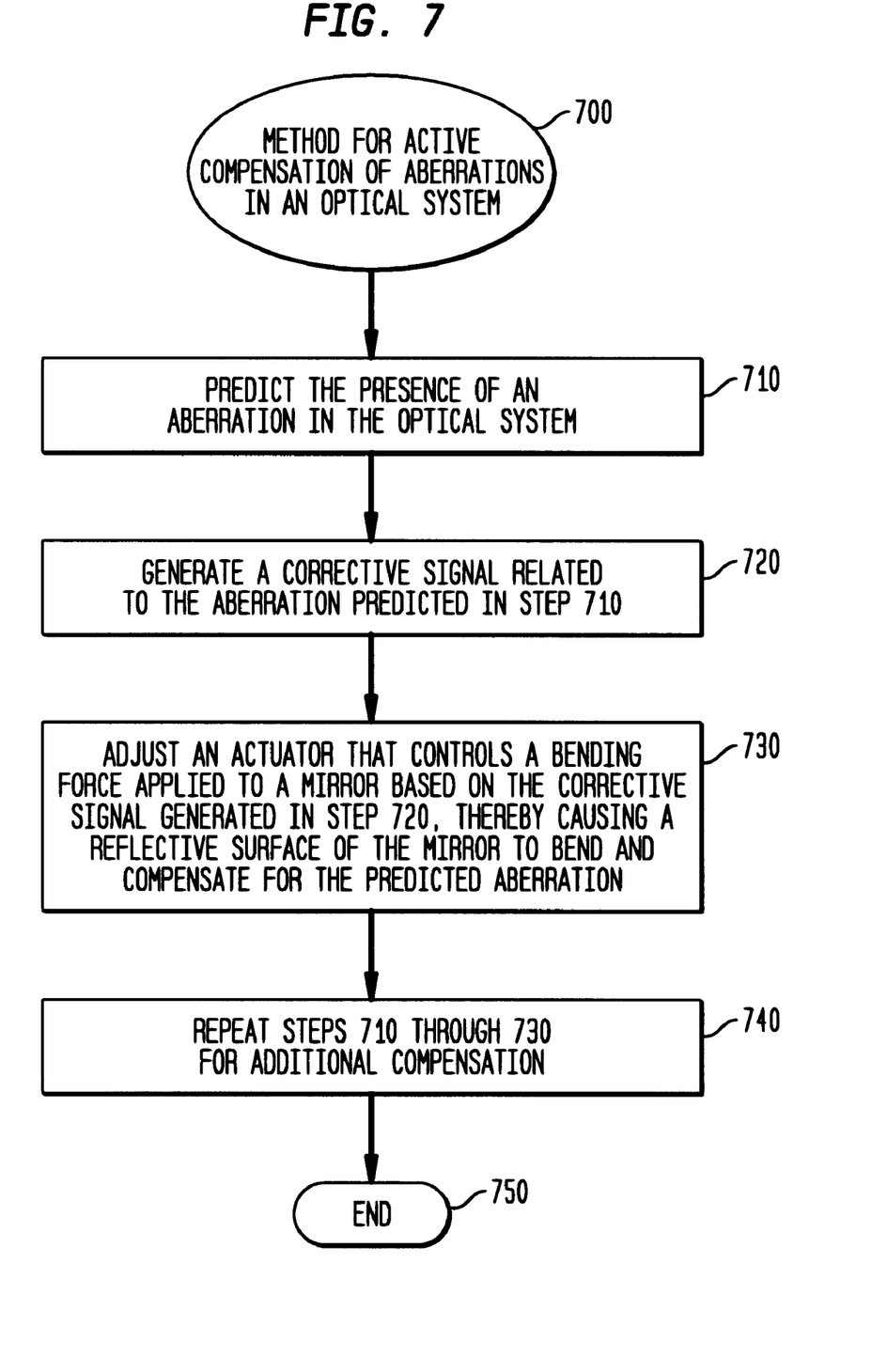
FIG. 7 is a flowchart of an example method for active compensation of astigmatism in an optical system according to an embodiment of the present invention.

In an embodiment of the present invention, system 600 controls aberrations such as astigmatism in optical system 100 using a method 700 as depicted in FIG. 7. Method 700 starts with system 600 in a state of equilibrium.

In step 710 of method 700, senor module 620 is used to monitor a parameter related to an aberration in optical system 100 and used to predict the presence of an aberration, such as astigmatism, in optical system 100. Sensing module 620 can monitor any parameter that is measurable and that can be related to the control of an aberration, such as astigmatism, in optical system 100. For example, sensing module 620 can monitor temperature at various locations in optical system 100. Temperature is one parameter that can be used to determine thermally induced optical variations in optical system 100 that affect astigmatism. The temperature monitored by sensing module 620 can be used, for example, in an algorithm that predicts the presents of astigmatism in optical system 100, or alternatively, the temperature monitored by sensing module 620 can be used to lookup a predetermined value in a lookup table stored, for example, in a memory unit 614, which is used to predict the presents of astigmatism in optical system 100. Sensing module 620 can also monitor other parameters such as, for example, electromagnetic energy exiting optical system 100 at beamsplitter block 150. Electromagnetic energy exiting optical system 100 can be used, for example, to determine whether astigmatism in optical system 100 is being corrected. Other parameters that can be monitored by sensing module 620 would be apparent to a person skilled in the relevant arts given the discussion herein.

In step 720 of method 700, control module 610 uses the output of sensing module 620 to generate a corrective signal related to an aberration, such as astigmatism. In an embodiment of the present invention, control module 610 communicates with senor module 620 using communications link 616. As shown in FIG. 6, control module 610 comprises a central processing unit (CPU) 612 and memory unit 614. In an embodiment, several parameters can be monitored simultaneously by senor module 620. Alternatively, several senor modules 620 can be used to monitor several parameters.

Data relating the output of sensing module 620 to an aberration, such as astigmatism, in optical system 100 can be determined empirically or analytically and stored in memory unit 614. One technique for storing the data in memory unit 614 is to store the data in a lookup table. For example, if sensing module 620 monitors both temperature and pressure, the various temperatures that can be measured by sensing module 620 can be stored in memory unit 614 in a lookup table that relates a temperature of optical system 100 to a pressure in pneumatic actuator 420. In this embodiment, CPU 612 receives temperature and pressure data from sensing module 620. CPU 612 then looks up the pressure for pneumatic actuator 420 that corresponds to the temperature data received form sensing module 620 in the lookup table stored in memory unit 614. CPU 612 generates a corrective signal based on the difference between the pressure data retrieved from the lookup table and the pressure data received from the output of sensing module 620. In another embodiment, control module 610 produces a corrective signal based solely on the combined outputs of sensing module 620 without retrieving data from a lookup table stored in memory. A person skilled in the relevant art will know that other methods and techniques of generating a corrective signal based on the output of sensing module 620 are contemplated and considered to be part of the present invention. These methods and techniques include both open-loop and closed-loop control means. These methods and techniques can also include feedback loops.

In step 730 of method 700, the corrective signal generated in step 720 is used to adjust the air pressure in pneumatic actuator 420 and thereby compensate for an aberration, such as astigmatism, in optical system 100. As shown in FIG. 6, system 600 has an air supply module 630. Air supply module 630 can be used to adjust the air pressure in pneumatic actuator 420. Adjusting the air pressure in pneumatic actuator 420 changes the bending or displacing force applied by compensation module 500 to the non-reflecting surface of mirror 170. In an embodiment, compressed air is stored in an air tank 635. The pressure of the compressed air in air tank 635 is determined and regulated by well-known mechanisms (not shown) for regulating and maintaining air pressure in a tank. These mechanisms form a part of air supply module 630. When air pressure in pneumatic actuator 420 needs to be increased based on the corrective signal, control module 610 sends a signal over a communications link 618 to three-way valve 640. The signal changes the position of three-way valve 640 and allows compressed air from air tank 635 to flow into pneumatic actuator 420 until the desired air pressure has been established in pneumatic actuator 420. When air pressure in pneumatic actuator 420 needs to be decreased based on the corrective signal, control module 610 sends a signal to three-way valve 640 that vents air in pneumatic actuator 420 to the environment until the desired air pressure in actuator 420 has been established.

In step 740 of method 700, steps 710 through 730 are continuously repeated in a loop to achieve additional correction or compensation of aberrations in optical system 100. Active compensation of aberrations in optical system 100 ends when control passes to step 750 of method 700.

Various embodiments of the present invention have been described above, which can be used to actively compensate for aberrations in an optical system. It should be understood that these embodiments have been presented by way of example only, and not limitation.

In particular, it will be understood by those skilled in the relevant art that embodiments of the present invention can be used to correct or compensate for aberrations in an optical system other than astigmatism, and that the present invention is not limited to only correcting or compensating for astigmatism. For example, the force modules described herein can be tailored to correct for different aberrations by varying the number of force bars per module, by varying the number attachment points between a mirror and a force bar, and/or by varying the distance of the attachment points from the central axis of the mirror. Additionally, the number of ends per force bar can be varied, e.g., a force bar can have three, four, five, or more ends depending on the shape and construction of a force bar. Higher order aberrations can be corrected, for example, by using multiple combinations of force modules at different orientations, as will be apparent to those skilled in the relevant art given the description herein.

It will also be understood by those skilled in the relevant art that various changes in form and details of the embodiments described above may be made without departing from the spirit and scope of the present invention as defined in the claims. Thus, the breadth and scope of the present invention should not be limited by any of the above-described exemplary embodiments, but should be defined only in accordance with the following claims and their equivalents.

What is claimed is:

1. An apparatus for active compensation of aberrations in an optical system, comprising:
   a first force bar having at least two ends configured for attachment to a first and second portion of a mirror;
   a second force bar having at least two ends configured for attachment to a third and fourth portion of a mirror; and
   at least one actuator, said actuator having a first end connected to said first force bar and a second end connected to said second force bar, such that longitudinal movement of said actuator between said first and second force bars applies a force to said mirror.

2. The apparatus of claim 1, wherein said first and second force bars each have two ends and wherein said first force bar is substantially perpendicular to said second force bar.

3. The apparatus of claim 1, wherein said first and second force bars each have three ends.

4. The apparatus of claim 2, wherein said first force bar has an opening near its longitudinal midpoint, and wherein said second force bar partially resides in said opening.

5. The apparatus of claim 4, wherein said first force bar is bifurcated to form said opening, and wherein said opening defines first and second opposed surfaces, said second force bar having a medial portion disposed within said opening and being connected to said first surface by at least one said actuator.

6. The apparatus of claim 5, wherein said at least one actuator has a plurality of actuators, said actuators being pneumatic bellows.

7. The apparatus of claim 6, further comprising:
   a support structure for supporting the weight of said first and second force bars; and
   a plurality of flexures for connecting said first and second force bars to said support structure, each of said flexures having a first end connected to said support structure and a second end connected to an end of said first or said second force bar.

8. The apparatus of claim 7, further comprising:
   a third force bar having ends configured for attachment to a peripheral portion of said mirror;
   a fourth force bar having ends configured for attachment to said peripheral portion of said mirror; and
   at least one additional actuator, said additional actuator having a first end connected to said third force bar and a second end connected to said fourth force bar, such that longitudinal movement of said actuator between said third and fourth force bars applies a force to said peripheral portion of said mirror.

9. The apparatus of claim 8, wherein said first and second force bars are aligned to compensate for Z5 astigmatism, and wherein said third and fourth force bars are aligned to compensate for Z6 astigmatism.

10. The apparatus of claim 9, wherein each of said force bars is a leaf spring.

* * * * *